(12) United States Patent
Takamine

(10) Patent No.: US 7,479,854 B2
(45) Date of Patent: Jan. 20, 2009

(54) BALANCED-TYPE SURFACE ACOUSTIC WAVE FILTER

(75) Inventor: Yuichi Takamine, Moriyama (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 11/686,624

(22) Filed: Mar. 15, 2007

(65) Prior Publication Data
US 2007/0152778 A1    Jul. 5, 2007

Related U.S. Application Data

(63) Continuation of application No. PCT/JP2005/003985, filed on Mar. 8, 2005.

(30) Foreign Application Priority Data
Sep. 15, 2004    (JP) .............................. 2004-268323

(51) Int. Cl.
H03H 9/64    (2006.01)
(52) U.S. Cl. ................ 333/195; 310/313 A; 310/313 D
(58) Field of Classification Search .................. 333/195
See application file for complete search history.

(56) References Cited

U.S. PATENT DOCUMENTS

| | | | |
|---|---|---|---|
| 5,994,980 A | 11/1999 | Tada | |
| 6,271,739 B1 | 8/2001 | Ueda et al. | |
| 6,504,454 B2 | 1/2003 | Takahashi | |
| 6,621,380 B2 | 9/2003 | Takamine | |
| 6,762,657 B2 | 7/2004 | Takamine | |
| 7,005,948 B2 | 2/2006 | Ouchi et al. | |
| 2001/0054942 A1* | 12/2001 | Takamine et al. | 333/195 |
| 2002/0017969 A1* | 2/2002 | Takamine | 333/193 |
| 2002/0047759 A1* | 4/2002 | Takamine | 333/193 |
| 2002/0175783 A1 | 11/2002 | Watanabe et al. | |
| 2003/0042999 A1 | 3/2003 | Takamine et al. | |

(Continued)

FOREIGN PATENT DOCUMENTS

JP    09-321574 A    12/1997

(Continued)

OTHER PUBLICATIONS

Official Communication for PCT/JP2005/003985; mailed on Jul. 12, 2005.

(Continued)

*Primary Examiner*—Barbara Summons
(74) *Attorney, Agent, or Firm*—Keating & Bennett, LLP

(57) ABSTRACT

In a balanced-type surface acoustic wave filter, a first longitudinally coupled resonator surface acoustic wave filter unit connected to an unbalanced signal terminal is connected in a cascade arrangement to a second longitudinally coupled resonator surface acoustic wave filter unit connected to a first balanced signal terminal and a second balanced signal terminal. When the number of electrode fingers included in each of narrow pitch electrode finger portions in a center second IDT of the first longitudinally coupled resonator surface acoustic wave filter unit is defined as N1, and the number of electrode fingers included in each of narrow pitch electrode finger portions in a center fifth IDT of the second longitudinally coupled resonator surface acoustic wave filter unit is defined as N2, the numbers N1 and N2 are set to N1>N2.

10 Claims, 9 Drawing Sheets

U.S. PATENT DOCUMENTS

2004/0201435 A1 * 10/2004 Ouchi et al. ............... 333/195

FOREIGN PATENT DOCUMENTS

| | | | |
|---|---|---|---|
| JP | 10-117123 | A | 5/1998 |
| JP | 11-097966 | A | 4/1999 |
| JP | 2001-217680 | A | 8/2001 |
| JP | 2002-009588 | A | 1/2002 |
| JP | 2002-084163 | A | 3/2002 |
| JP | 2002-314370 | * | 10/2002 |
| JP | 2003-069383 | A | 3/2003 |
| JP | 2003-249835 | A | 9/2003 |
| JP | 2004-235909 | A | 8/2004 |
| JP | 2004-312576 | A | 8/2007 |

OTHER PUBLICATIONS

Official communication issued in the couterpart Japanese Application No. 2004-268323, mailed on Jul. 24, 2007.

* cited by examiner

S11

S22

S11

S22

S11

S22

S11

S22

S11

S22

BALANCED-TYPE SURFACE ACOUSTIC WAVE FILTER

BACKGROUND OF THE INVENTION

1. Field of the Invention

The present invention relates to a surface acoustic wave filter in which first and second longitudinally coupled resonator surface acoustic wave filter units are connected in a cascade arrangement, and more particularly, to a balanced-type surface acoustic wave filter having a balanced-to-unbalanced conversion function.

2. Description of the Related Art

With the miniaturization of mobile telephones, RF stages including band-pass filters are required to be reduced in size. Recently, balanced-type surface acoustic wave filters covering high frequencies and having a balanced-to-unbalanced conversion function have been used as such band-pass filters.

An output terminal of a balanced-type surface acoustic wave filter having the balanced-to-unbalanced conversion function is connected to a mixer IC with balanced input and output or differential input and output, that is, to a balanced-type mixer IC. The balanced-type mixer IC reduces the effect of noise and stabilizes the output. Accordingly, such balanced-type mixer ICs are currently in widespread use so as to improve characteristics of mobile telephones.

The impedance of a surface acoustic wave filter used for an RF stage is typically about 50Ω. On the other hand, the input impedance of a known balanced-type mixer IC is typically in the range of about 150Ω to about 200Ω. Accordingly, in a surface acoustic wave filter having the balanced-to-unbalanced conversion function, the ratio of the impedance of an unbalanced signal terminal to the impedance of a balanced signal terminal is often set so that it falls within a range of about 1:3 to about 1:4.

An example of a surface acoustic wave filter having the balanced-to-unbalanced conversion function is described in Japanese Unexamined Patent Application Publication No. 11-97966 (Patent Document 1). FIG. 15 is a schematic plan view showing an electrode configuration of a balanced-type surface acoustic wave filter described in Patent Document 1.

In a surface acoustic wave filter 501, a first longitudinally coupled resonator surface acoustic wave filter unit 511 is connected to an unbalanced signal terminal 502. The first longitudinally coupled resonator surface acoustic wave filter unit 511 includes IDTs 512, 513, and 514 disposed along a propagation direction of a surface acoustic wave. The center IDT 513 is connected to the unbalanced signal terminal 502. Reflectors 515 and 516 are disposed on either side of a region including the IDTs 512 to 514 in the propagation direction of the surface acoustic wave.

On the other hand, a second longitudinally coupled resonator surface acoustic wave filter unit 521 is connected to the first longitudinally coupled resonator surface acoustic wave filter unit 511. The second longitudinally coupled resonator surface acoustic wave filter unit 521 includes IDTs 522, 523, and 524 which are disposed in the propagation direction of a surface acoustic wave, and reflectors 525 and 526. The IDTs 522 and 524 are electrically connected to the IDTs 512 and 514 via signal lines 505 and 506, respectively. The center IDT 523 is divided in the propagation direction of the surface acoustic wave, whereby a first IDT portion 523a and a second IDT portion 523b are provided. The IDT portions 523a and 523b are electrically connected to a first balanced signal terminal 503 and a second balanced signal terminal 504, respectively.

Thus, in the surface acoustic wave filter 501, the first longitudinally coupled resonator surface acoustic wave filter unit 511 and the second longitudinally coupled resonator surface acoustic wave filter unit 521 are connected in a cascade arrangement. Patent Document 1 describes that the impedance of the balanced signal terminals 503 and 504 is about 200Ω. That is, the balanced-type surface acoustic wave filter 501 having the above-described impedance ratio of about 1:4 is disclosed.

On the other hand, Japanese Unexamined Patent Application Publication No. 9-321574 (Patent Document 2) discloses a surface acoustic wave filter that does not have the balanced-to-unbalanced conversion function. As shown in FIG. 16, in a surface acoustic wave filter 601 described in Patent Document 2, a first longitudinally coupled resonator surface acoustic wave filter unit 602 and a second longitudinally coupled resonator surface acoustic wave filter unit 603 are connected in a cascade arrangement. The first longitudinally coupled resonator surface acoustic wave filter unit 602 is connected to an input terminal 604. The second longitudinally coupled resonator surface acoustic wave filter unit 603 is connected to an output terminal 605.

In Patent Document 2, different electrode finger cross widths are set to the first longitudinally coupled resonator surface acoustic wave filter unit 602 and the second longitudinally coupled resonator surface acoustic wave filter unit 603, whereby an input impedance of about 50Ω and an output impedance of about 150Ω are set. That is, a surface acoustic wave filter having the impedance ratio of about 1:3 is provided in which two elements are connected in a cascade arrangement.

Currently, a balanced-type mixer IC having an input impedance of about 100Ω is increasingly used as a balanced-type mixer IC connected to a stage subsequent to the above-described surface acoustic wave filter. Accordingly, a surface acoustic wave filter used in an RF stage is required to have a low output impedance. That is, a surface acoustic wave filter having a ratio of the impedance of an input terminal to the impedance of an output terminal of approximately 1:2 and having the balanced-to-unbalanced conversion function is required.

In the surface acoustic wave filter 601 described in Patent Document 2 which does not have the balanced-to-unbalanced conversion function and in which two elements are connected in a cascade arrangement, the ratio of an input impedance to an output impedance of about 1:3 is set by increasing the electrode finger cross width of the first longitudinally coupled resonator surface acoustic wave filter unit 602 and decreasing the electrode finger cross width of the second longitudinally coupled resonator surface acoustic wave filter unit 603. However, in such a configuration, an impedance mismatch is likely to occur at a cascade connection point. This causes an increased passband insertion loss.

In the balanced-type surface acoustic wave filter 501 described in Patent Document 1, the fifth IDT 523, which is a center IDT in the second longitudinally coupled resonator surface acoustic wave filter unit 521, is divided into two portions, the IDT portions 523a and 523b. The IDT portions 523a and 523b are connected in series. Inevitably, the impedance of the balanced signal terminals 503 and 504 increases. Accordingly, the impedance ratio of about 1:4 is set as described above. In such a configuration, the impedance ratio may be controlled by changing electrode finger cross widths as described in Patent Document 2. However, in order to achieve the ratio of an input impedance to an output impedance of about 1:2 by using the method of changing electrode finger cross widths, the electrode finger cross width of the IDT 523 connected to the balanced signal terminals 503 and 504 is required to be about twice the electrode finger cross width of the IDT 513 connected to the unbalanced signal terminal 502. This not only increases the size of the electrodes but also increase the size of the entire surface acoustic wave filter 501.

SUMMARY OF THE INVENTION

To overcome the problems described above, preferred embodiments of the present invention provide a balanced-type surface acoustic wave filter capable of achieving the ratio of the impedance of an unbalanced signal terminal to the impedance of balanced signal terminals of approximately 1:2 without increasing a passband insertion loss or the size of an element.

A balanced-type surface acoustic wave filter according to a preferred embodiment of the present invention includes an unbalanced signal terminal and first and second balanced signal terminals, and has a balanced-to-unbalanced conversion function. The balanced-type surface acoustic wave filter includes a piezoelectric substrate, a first longitudinally coupled resonator surface acoustic wave filter unit including first, second, and third IDTs disposed along a propagation direction of a surface acoustic wave on the piezoelectric substrate, the second IDT being connected to the unbalanced signal terminal, and a second longitudinally coupled resonator surface acoustic wave filter unit including fourth, fifth, and sixth IDTs disposed along a propagation direction of a surface acoustic wave on the piezoelectric substrate, the second longitudinally coupled resonator surface acoustic wave filter unit being connected in a cascade arrangement to the first longitudinally coupled resonator surface acoustic wave filter unit, the fifth IDT being connected to the first and second balanced signal terminals. The second IDT includes narrow pitch electrode finger portions extending from end portions adjacent to the first and third IDTs toward a center thereof in the propagation direction of the surface acoustic wave, and the fifth IDT includes narrow pitch electrode finger portions extending from end portions adjacent to the fourth and sixth IDTs toward a center thereof in the propagation direction of the surface acoustic wave, the narrow pitch electrode finger portions each including some electrode fingers whose electrode periods are smaller than those of electrode fingers in a center portion of a corresponding IDT. When the number of electrode fingers included in each of the narrow pitch electrode finger portions in the second IDT is defined as N1 and the number of electrode fingers included in each of the narrow pitch electrode finger portions in the fifth IDT is defined as N2, the numbers N1 and N2 are set to N1>N2.

When an electrode finger pitch of each of the narrow pitch electrode finger portions in the second IDT is defined as P1 and an electrode finger pitch of each of the narrow pitch electrode finger portions in the fifth IDT is defined as P2, the electrode finger pitches P1 and P2 are set to P1>P2.

Preferably, the balanced-type surface acoustic wave filter further includes a first signal line that connects the first and fourth IDTs and a second signal line that connects the third and sixth IDTs. The first to sixth IDTs are configured so that an electric signal propagating through the first signal line is 180° out of phase with an electric signal propagating through the second signal.

Preferably, the first longitudinally coupled resonator surface acoustic wave filter unit and the second longitudinally coupled resonator surface acoustic wave filter unit are connected in a cascade arrangement on the piezoelectric substrate. The first longitudinally coupled resonator surface acoustic wave filter unit is connected to the unbalanced signal terminal. The second longitudinally coupled resonator surface acoustic wave filter unit is connected to the first and second balanced signal terminals. Thus, a surface acoustic wave filter having the balanced-to-unbalanced conversion function is provided. When the number of electrode fingers included in each of the narrow pitch electrode finger portions in the second IDT is defined as N1, and the number of electrode fingers included in each of the narrow pitch electrode finger potions in the fifth IDT is defined as N2, the numbers N1 and N2 are set to N1>N2. Accordingly, as will be apparent from an example of an experiment, the impedance of the first longitudinally coupled resonator surface acoustic wave filter unit connected to the unbalanced signal terminal can be significantly changed without losing the insertion loss and VSWR characteristics. Furthermore, the impedance ratio of the impedance of the unbalanced signal terminal to the impedance of the first and second balanced signal terminals can be significantly changed. Accordingly, a balanced-type surface acoustic wave filter having the impedance ratio of about 1:2 is easily provided.

According to preferred embodiments of the present invention, a balanced-type mixer IC having an output impedance of about 100Ω can be connected to a stage subsequent to the surface acoustic wave filter. Accordingly, a surface acoustic wave filter having excellent filter characteristics and the balanced-to-unbalanced conversion function is provided. With preferred embodiments of the present invention, for example, miniaturization of an RF stage of a mobile telephone is achieved.

An electrode finger pitch of each of the narrow pitch electrode finger portions in the second IDT is defined as P1, and an electrode finger pitch of each of the narrow pitch electrode finger portions in the fifth IDT is defined as P2. When the electrode finger pitches P1 and P2 are set to P1>P2, the insertion loss and VSWR in the passband are further reduced and the filter characteristics are further improved.

When the balanced-type surface acoustic wave filter further includes a first signal line that connects the first IDT included in the first longitudinally coupled resonator surface acoustic wave filter unit and the fourth IDT included in the second longitudinally coupled resonator surface acoustic wave filter unit and a second signal line that connects the third and sixth IDTs, and when the first to sixth IDTs are configured such that an electric signal propagating through the first signal line is 180° out of phase with an electric signal propagating through the second signal line, the phase balance and the amplitude balance are improved.

The amplitude balance and the phase balance are defined by the following equations 1 and 2 when the above-described surface acoustic wave device having the balanced-to-unbalanced conversion function is a three-port device and, for example, the unbalanced signal terminal is a port 1 and the balanced signal terminals are ports 2 and 3, respectively.

$$\text{Amplitude balance} = |A|, A = |20 \log (S21)| - |20 \log (S31)| \quad \quad 1$$

$$\text{Phase balance} = |B|, B = |\angle S21 - \angle S31| \quad \quad 2$$

The numeral S21 denotes a transfer coefficient for the transfer from the port 1 to the port 2. The numeral S31 denotes a transfer coefficient for the transfer from the port 1 to the port 3. It is desirable that the amplitude balance be 0 dB and the phase balance be 180 degrees in the passband in the filter characteristics of a surface acoustic wave device.

Other features, elements, steps, characteristics and advantages of the present invention will become more apparent

DETAILED DESCRIPTION OF PREFERRED EMBODIMENTS

Preferred embodiments of the present invention will be described in detail with reference to the accompanying drawings.

Figure 1:
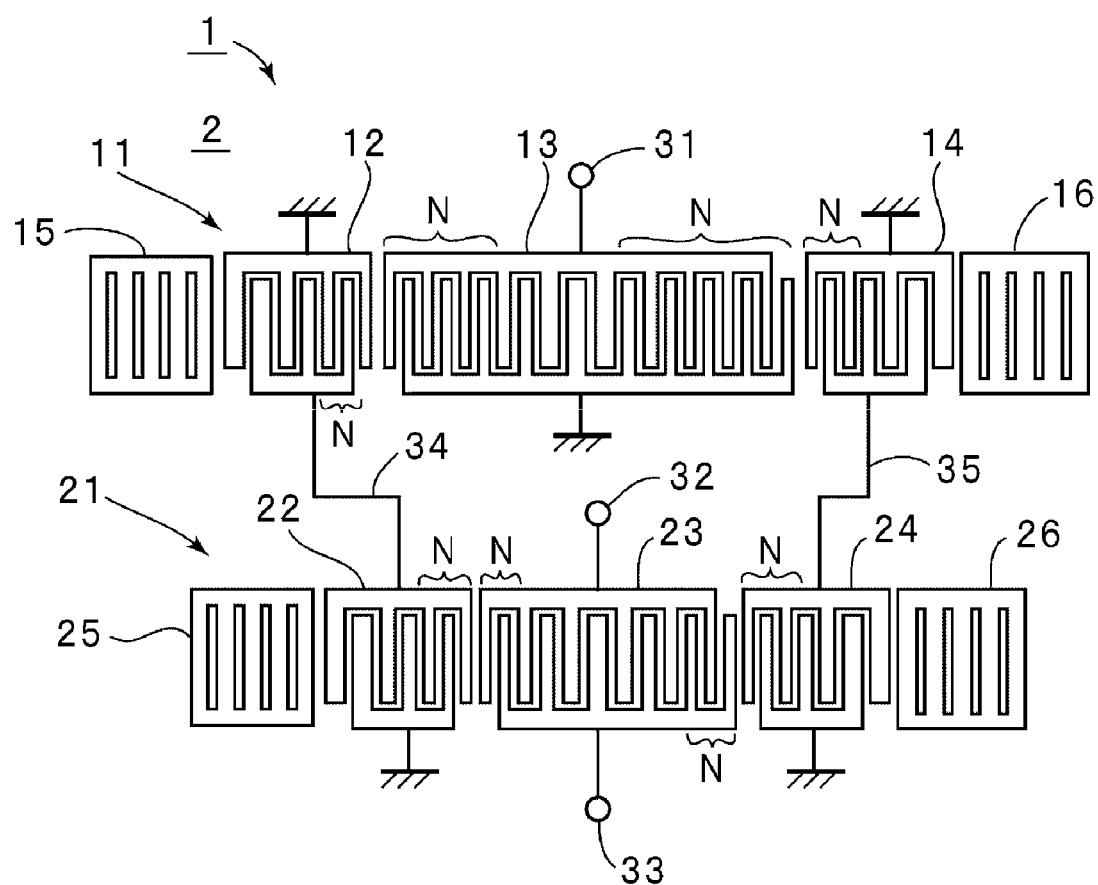
FIG. 1 is a schematic plan view showing an electrode configuration of a balanced-type surface acoustic wave filter according to a first preferred embodiment of the present invention.

FIG. 1 is a schematic plan view showing an electrode configuration of a balanced-type surface acoustic wave filter according to a first preferred embodiment of the present invention.

A balanced-type surface acoustic wave filter 1 includes electrodes shown in FIG. 1 that are provided on a piezoelectric substrate 2, such as a 40±5° Y-cut X-propagating LiTaO$_3$ substrate, for example. That is, a first longitudinally coupled resonator surface acoustic wave filter unit 11 and a second longitudinally coupled resonator surface acoustic wave filter unit 21 are provided on the piezoelectric substrate 2.

The first longitudinally coupled resonator surface acoustic wave filter unit 11 includes a first IDT 12, a second IDT 13, and a third IDT 14 which are disposed along a propagation direction of a surface acoustic wave. One end of the center second IDT 13 is connected to an unbalanced signal terminal 31. Reflectors 15 and 16 are disposed on either side of a region including the IDTs 12 to 14 in the propagation direction of the surface acoustic wave.

Each of the first IDT 12, the second IDT 13, and the third IDT 14 includes a narrow pitch electrode finger portion N that is disposed next to an adjacent IDT. The narrow pitch electrode finger portion N is an electrode finger portion in which an electrode finger pitch is narrower than that of an electrode finger portion other than the narrow pitch electrode finger portion N. For example, in the IDT 12, a pitch of some of the electrode fingers included in a region extending from an end portion adjacent to the IDT 13 toward the center thereof is narrower than that of the other electrode fingers. A portion including a plurality of electrode fingers between which a narrow electrode finger pitch is set is the narrow pitch electrode finger portion N.

The discontinuity between adjacent IDTs is improved by setting the narrow pitch electrode finger portions N.

The center IDT 13 includes the narrow pitch electrode finger portion N in an end portion adjacent to the IDT 12 and the narrow pitch electrode finger portion N in an end portion adjacent to the IDT 14. That is, the IDT 13 includes the narrow pitch electrode finger portions N extending from the end portions on the sides of the IDTs 12 and 14 toward the center thereof. The electrode finger pitch between a plurality of electrode fingers included in each of the narrow pitch electrode finger portions N is narrower than that between electrode fingers included in the center portion thereof. In the IDT 14, the narrow pitch electrode finger portion N is similar to that of the IDT 12.

The second longitudinally coupled resonator surface acoustic wave filter unit 21 includes a fourth IDT 22, a fifth IDT 23, and a sixth IDT 24 which are disposed along the propagation direction of a surface acoustic wave. Reflectors 25 and 26 are disposed on either side of a region including the IDTs 22 to 24 in the propagation direction of the surface acoustic wave.

One end of the center fifth IDT 23 is electrically connected to a first balanced signal terminal 32, and the other opposite end is electrically connected to a second balanced signal terminal 33.

Like the IDTs 12 to 14, each of the IDTs 22 to 24 includes the narrow pitch electrode finger portion N. The narrow pitch electrode finger portion N is disposed in an end portion of the IDT 22 on the side of the IDT 23, end portions of the IDT 23 on the sides of the IDTs 22 and 24, and an end portion of the IDT 24 on the side of the IDT 23.

One end of the first IDT 12 is electrically connected to the fourth IDT 22 via a first signal line 34. One end of the third IDT 14 is electrically connected to the sixth IDT 24 via a second signal line 35.

In this preferred embodiment, the number of electrode fingers in the second IDT 13 is set to an even number. The first IDT 12 and the third IDT 14 are arranged so that they are symmetrical about a virtual line that passes through the center of the IDT 13 and is substantially perpendicular to the propagation direction of the surface acoustic wave. Accordingly, an electric signal propagating through the first signal line 34 is 180° out of phase with an electric signal propagating through the second signal line 35.

The electrode configuration including the first longitudinally coupled resonator surface acoustic wave filter unit 11 and the second longitudinally coupled resonator surface acoustic wave filter unit 21 is made of an appropriate metal, such as Al or an Al alloy.

One of the unique features of the surface acoustic wave filter 1 according to this preferred embodiment is that the number N1 of electrode fingers in one of the narrow pitch electrode finger portions N included in the second IDT 13 is greater than the number N2 of electrode fingers in one of the narrow pitch electrode finger portions N included in the fifth IDT 23. Accordingly, an impedance ratio, which is the ratio of the impedance of the unbalanced signal terminal 31 to the impedance of the balanced signal terminals 32 and 33, can be easily controlled. For example, the impedance ratio can be set to about 1:2. This impedance control will be described on the basis of a specific example of an experiment.

In the following example of an experiment, a GSM850 receiving surface acoustic wave filter was prepared using a 40±5° Y-cut X-propagating LiTaO$_3$ substrate as the piezoelectric substrate 2. The passband of this surface acoustic wave filter was 869 MHz to 894 MHz. Each electrode was formed in accordance with the following design parameters. The impedance of the unbalanced signal terminal 31 was set to about 50Ω, and the impedance of the balanced signal terminals 32 and 33 was set to about 100Ω.

Here, λI indicates a wavelength determined by the electrode finger pitch of an electrode finger portion other than the narrow pitch electrode finger portion N in each of the IDTs 12 to 14 and the IDTS 22 to 24.

Electrode finger cross width: 24.2 λI

Numbers of electrode fingers included in the IDTs in the first longitudinally coupled resonator surface acoustic wave filter unit 11: IDT 12/IDT 13/IDT 14=28 (4)/(8) 38 (8)/(4) 28

The numeral 28 (4) indicates that the number of electrode fingers in a portion other than the narrow pitch electrode finger portion N in the first IDT 12 is 28, and the number of electrode fingers in the narrow pitch electrode finger portion N is 4. The numeral (8) 38 (8) indicates that the number N1 of electrode fingers in one of the narrow pitch electrode finger portions N is 8, the number of electrode fingers in the center portion other than the narrow pitch electrode finger portions N is 38, and the number N1 of electrode fingers in the other narrow pitch electrode finger portion N is 8 in the second IDT 13.

Numbers of electrode fingers in the IDTs included in the second longitudinally coupled resonator surface acoustic wave filter unit 21: IDT 22/IDT 23/IDT 24=28 (4)/(4) 38 (4)/(4) 28 (N2=4)

Number of electrode fingers included in each of the reflectors 15, 16, 25, and 26=30

Metallization ratio of the IDTs and the reflectors=0.70

Electrode film thickness=0.079 λI

Figure 2:
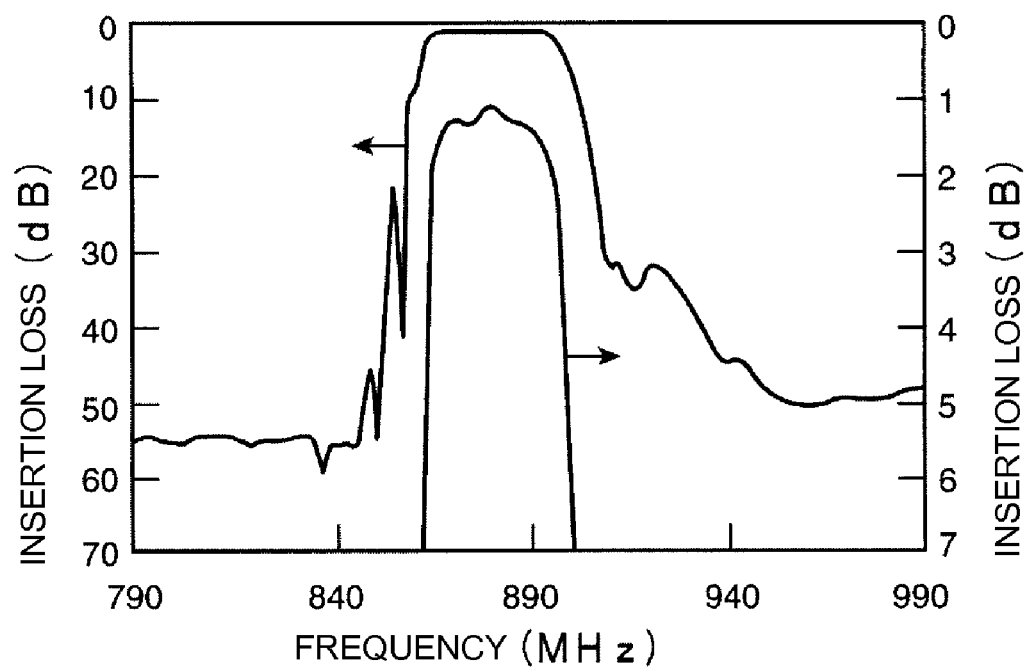
FIG. 2 is a diagram showing the insertion loss-frequency characteristics of the surface acoustic wave filter according to the first preferred embodiment of the present invention.
Figure 3:
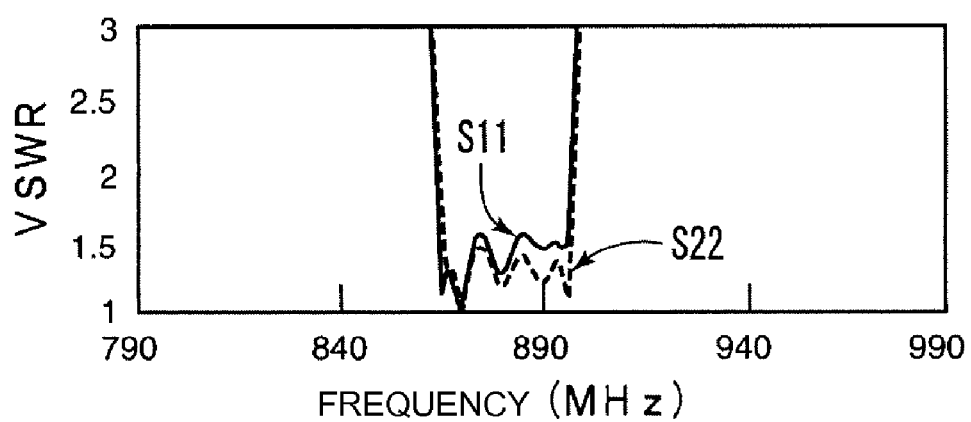
FIG. 3 is a diagram showing the VSWR characteristics of the surface acoustic wave filter according to the first preferred embodiment of the present invention.

Electrode finger pitch P1 of each of the narrow pitch electrode finger portions N included in the second IDT 13=0.946 λI, and electrode finger pitch P2 of each of the narrow pitch electrode finger portions N included in the fifth IDT 23=0.914 λI The insertion loss-frequency characteristics of the surface acoustic wave filter 1 according to this preferred embodiment made as described above is shown in FIG. 2. The VSWR characteristics of the surface acoustic wave filter 1 are shown in FIG. 3. A reference numeral S11 in FIG. 3 denotes the VSWR characteristics of the unbalanced signal terminal 31. A reference numeral S22 denotes the VSWR characteristics of the balanced signal terminals 32 and 33. In the following description, the reference numeral S11 denotes the characteristics of an unbalanced signal terminal, and the reference numeral S22 denotes the characteristics of balanced signal terminals.

Figure 4A:
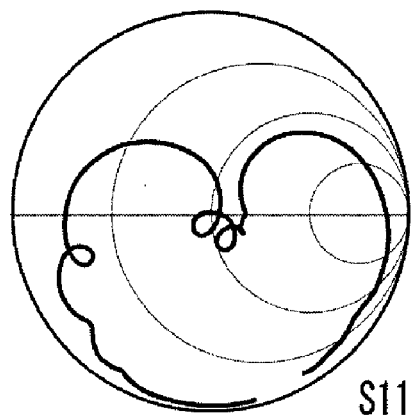
FIGS. 4A and 4B are Smith charts showing the reflection characteristics of an unbalanced signal terminal and balanced signal terminals included in surface acoustic wave filter units according to the first preferred embodiment of the present invention.
Figure 4B:
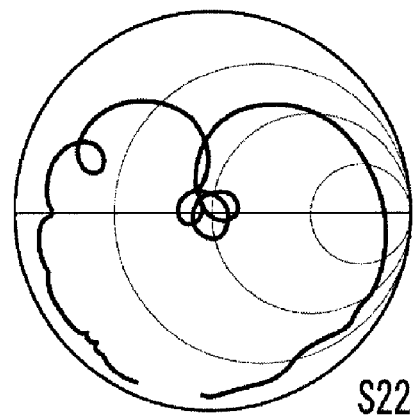

FIGS. 4A and 4B are Smith charts showing the reflection characteristics of the unbalanced signal terminal and the balanced signal terminals included in the surface acoustic wave filter 1 according to this preferred embodiment.

In Smith charts illustrated in FIGS. 4A and 4B, the normalized impedance of an unbalanced signal terminal is set to about 50Ω, and the normalized impedance of balanced signal terminals is set to about 100Ω.

For comparison, a first comparative example was provided by making the electrode finger cross width of the first longitudinally coupled resonator surface acoustic wave filter unit to be different from that of the second longitudinally coupled resonator surface acoustic wave filter unit to control an impedance ratio. More specifically, the first comparative example was created in accordance with the following design parameters.

Electrode finger cross width of the first longitudinally coupled resonator surface acoustic wave filter unit: 44.0 λI, and electrode finger cross width of the second longitudinally coupled resonator surface acoustic wave filter unit: 30.8 λI Numbers of electrode fingers included in the three IDTs in each of the first and second longitudinally coupled resonator surface acoustic wave filter units: 28 (4)/(4) 38 (44)/(4) 28

Number of electrode fingers included in each of the reflectors: 30

Metallization ratio: 0.70

However, the metallization ratio of the center IDT in the second longitudinally coupled resonator surface acoustic wave filter unit was set to 0.60.

Electrode film thickness: 0.079 λI

Figure 5:
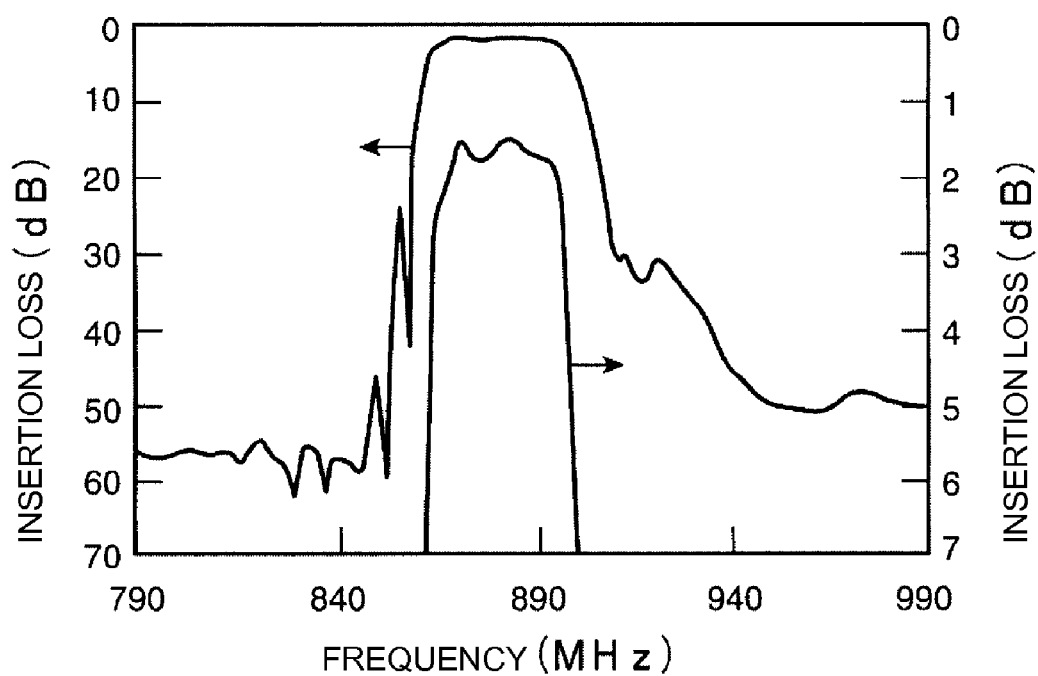
FIG. 5 is a diagram showing the insertion loss-frequency characteristics of a surface acoustic wave filter that is a first comparative example.
Figure 6:
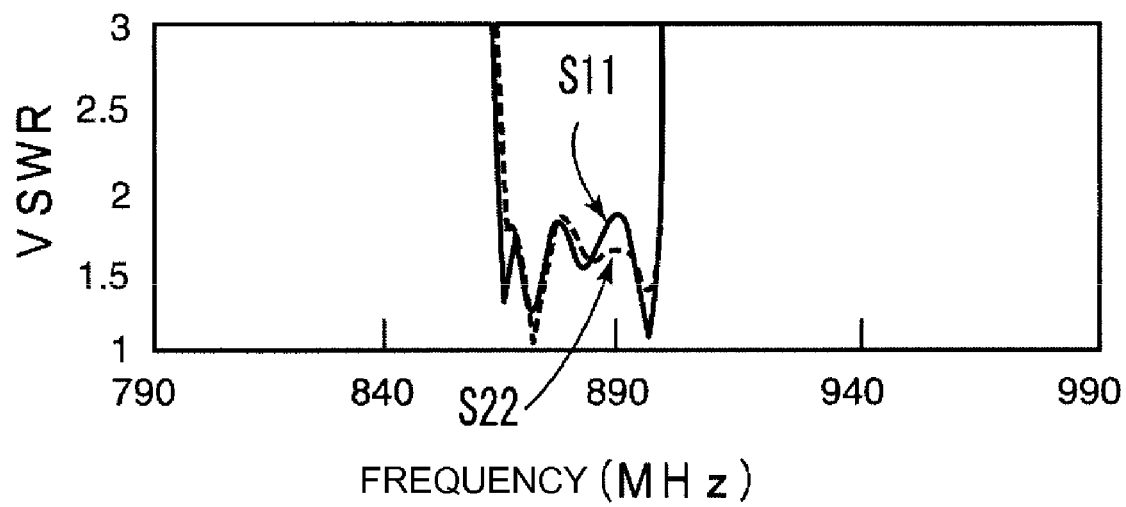
FIG. 6 is a diagram showing the VSWR characteristics of the surface acoustic wave filter of the first comparative example.
Figure 7A:
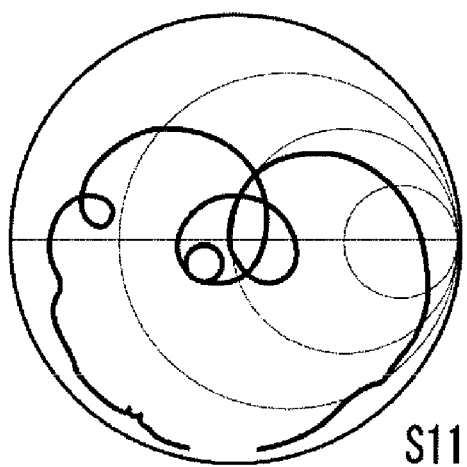
FIGS. 7A and 7B are Smith charts showing the reflection characteristics of an unbalanced signal terminal and balanced signal terminals included in surface acoustic wave filter units in the first comparative example.
Figure 7B:
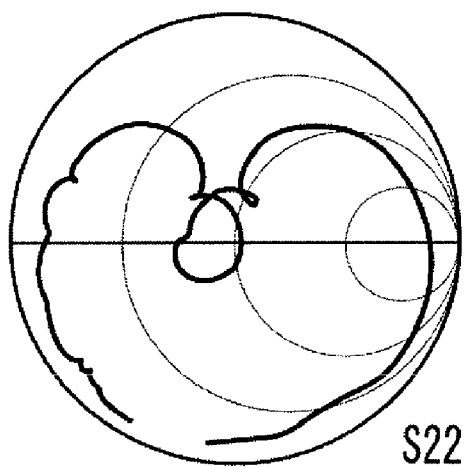

Other configurations are substantially the same as those of the surface acoustic wave filter according to the above-described preferred embodiment. Thus, a surface acoustic wave filter was made as the first comparative example. The insertion loss-frequency characteristics of the surface acoustic wave filter of the first comparative example is shown in FIG. 5. The VSWR characteristics of the surface acoustic wave filter of the first comparative example are shown in FIG. 6. FIGS. 7A and 7B are Smith charts showing the reflection characteristics of an unbalanced signal terminal and balanced signal terminals included in the surface acoustic wave filter of the first comparative example.

Furthermore, in order to control the impedance of an unbalanced signal terminal and the impedance of balanced signal terminals, the surface acoustic wave filter 501 shown in FIG.

15 was made as a second comparative example in accordance with the following design parameters.

Figure 15:
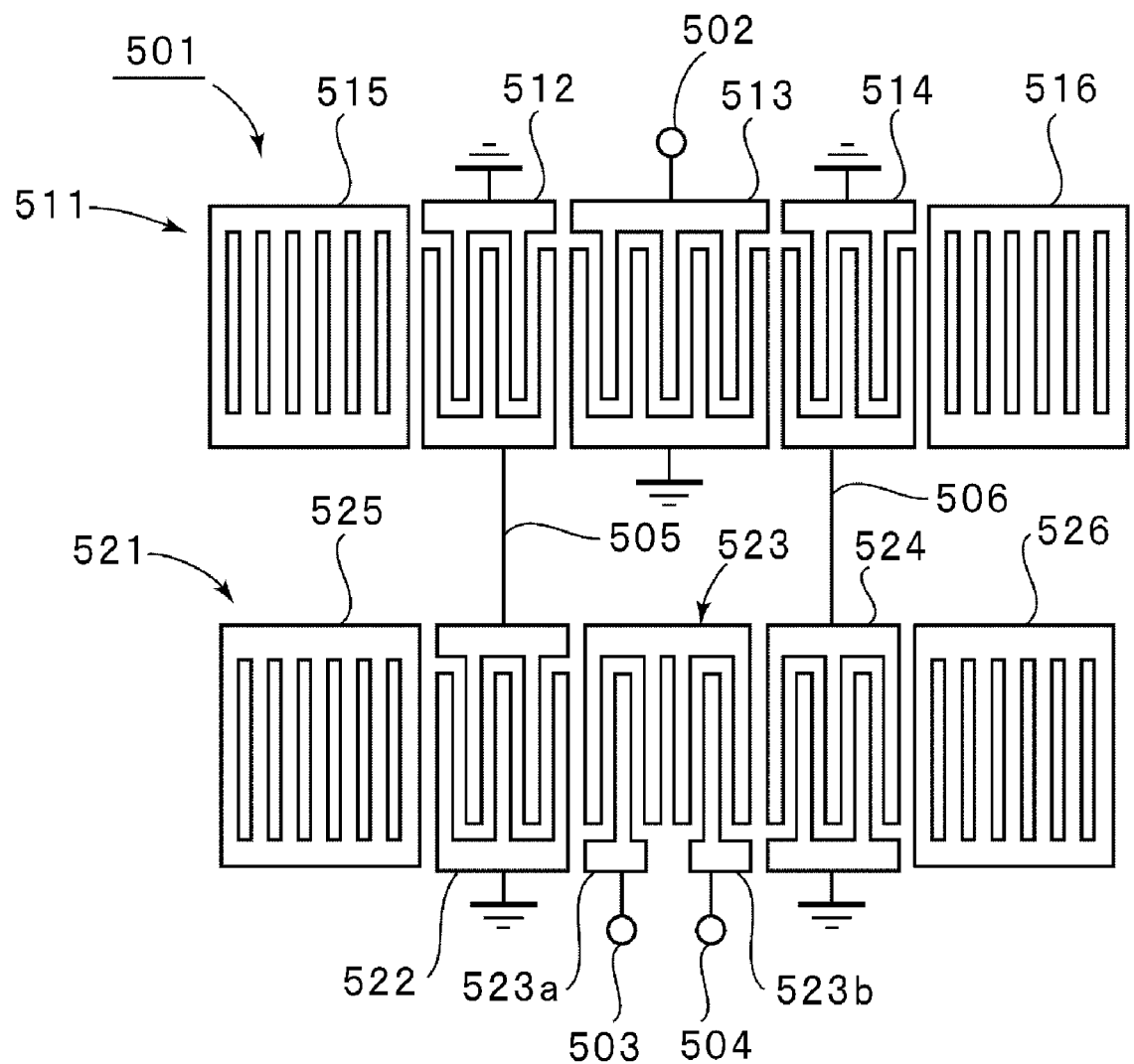
FIG. 15 is a schematic plan view showing an exemplary electrode configuration of a known surface acoustic wave filter.
Figure 16:
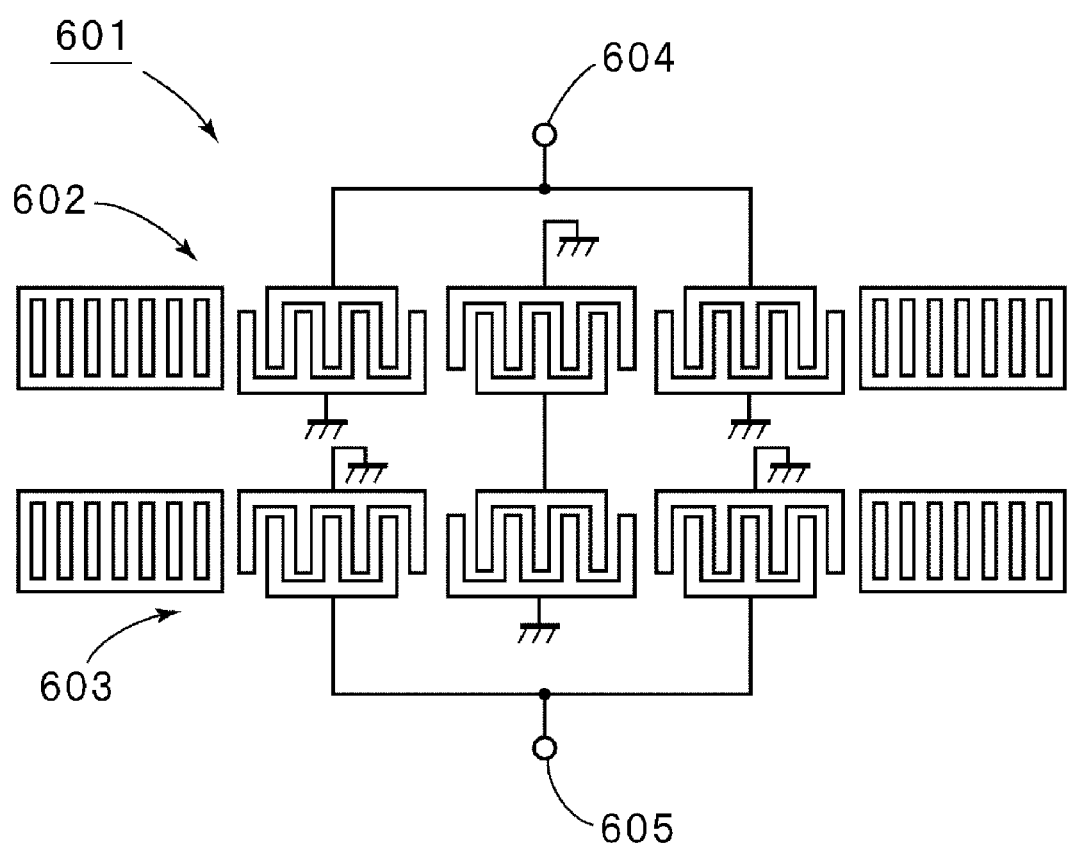
FIG. 16 is a schematic plan view showing another exemplary electrode configuration of a known surface acoustic wave filter.

Numbers of electrode fingers included in the IDTs 512 to 514 in the first longitudinally coupled resonator surface acoustic wave filter unit 511 shown in FIG. 15: IDT 512/IDT 513/IDT 514=26 (5)/(3) 44 (3)/(5) 26

Numbers of electrode fingers included in the IDTs 522 to 524 in the second longitudinally coupled resonator surface acoustic wave filter unit 521: IDT 522/IDT 523/IDT 524=26 (5)/(7) 34 (7)/(5) 26

Number of electrode fingers included in each of the reflectors: 30

Metallization ratio: 0.70, however, only the metallization ratio of the IDT 513 was set to 0.60.

Electrode film thickness: 0.079 λI

In order to perform impedance matching, an inductance of about 47 nH was interposed between the first balanced signal terminal 503 and the second balanced signal terminal 504.

Figure 8:
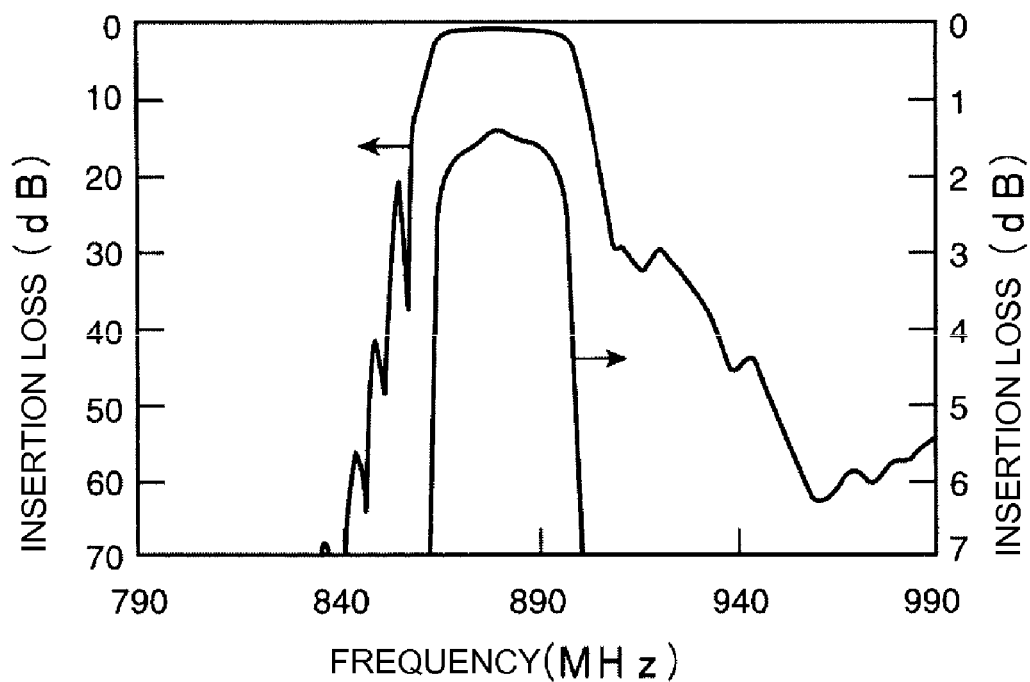
FIG. 8 is a diagram showing the insertion loss-frequency characteristics of a surface acoustic wave filter that is a second comparative example.
Figure 9:
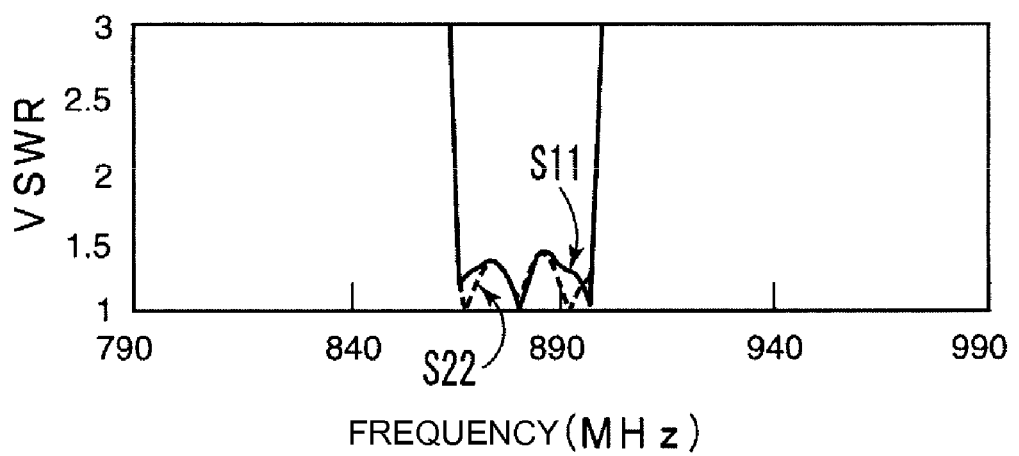
FIG. 9 is a diagram showing the VSWR characteristics of the surface acoustic wave filter of the second comparative example.
Figure 10A:
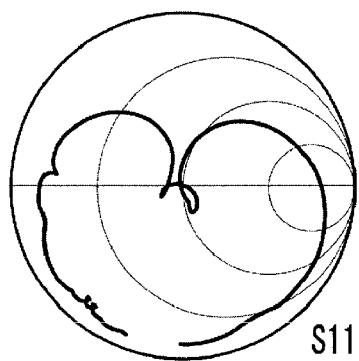
FIGS. 10A and 10B are Smith charts showing the reflection characteristics of an unbalanced signal terminal and balanced signal terminals included in surface acoustic wave filter units in the second comparative example.
Figure 10B:
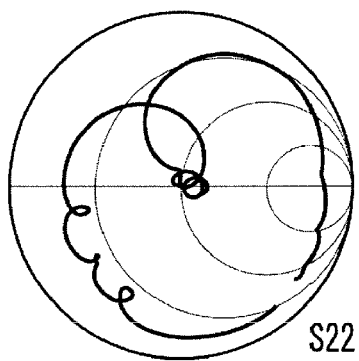
Figure 11A:
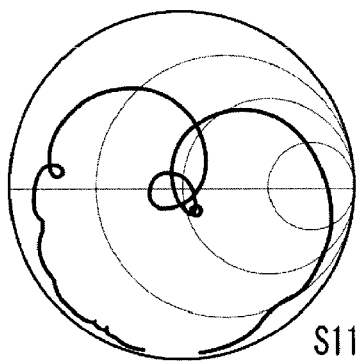
FIGS. 11A and 11B are Smith charts showing the reflection characteristics of an unbalanced signal terminal and balanced signal terminals included in surface acoustic wave filter units in a first reference example, the normalized impedances of the unbalanced signal terminal and the balanced signal terminals being set to about 50Ω.
Figure 11B:
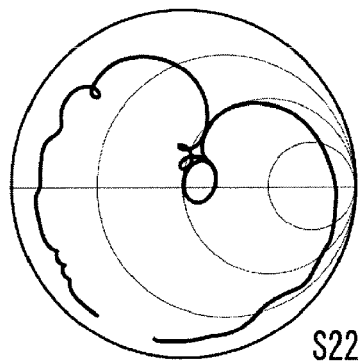

FIG. 8 shows the insertion loss-frequency characteristics of the surface acoustic wave filter of the second comparative example. FIG. 9 shows the VSWR characteristics of the surface acoustic wave filter of the second comparative example. FIGS. 10A and 10B are Smith charts showing the reflection characteristics of an unbalanced signal terminal and balanced signal terminals included in the surface acoustic wave filter of the second comparative example, respectively.

As is apparent from comparisons between FIGS. 2 to 4B and FIGS. 5 to 7B, in the case of the surface acoustic wave filter of the first comparative example, the maximum insertion loss was about 1.82 dB and the maximum value of the VSWR was about 1.84 in a passband of 869 MHz to 894 MHz. On the other hand, in the case of the surface acoustic wave filter according to the above-described preferred embodiment, the maximum insertion loss was about 1.60 dB and the maximum value of the VSWR was about 1.53.

That is, according to the above-described preferred embodiment, the maximum insertion loss is reduced by about 0.2 dB and the VSWR is reduced by about 0.3 in the passband as compared to the first comparative example. The reason for this is that the electrode finger cross widths of the IDTs connected in a cascade arrangement are the same and impedance mismatching does not occurs in the surface acoustic wave filter according to the above-described preferred embodiment different from the first comparative example. More specifically, the electrode finger cross widths of the IDTs 12 and 22 are the same, and the electrode finger cross widths of the IDTs 14 and 24 are the same. Accordingly, impedance mismatching does not occur.

On the other hand, as is apparent from comparisons between FIGS. 2 to 4B and FIGS. 8 to 10B, in the case of the second comparative example, the maximum insertion loss was about 1.85 dB and the maximum value of the VSWR was about 1.40 in the passband. Accordingly, the maximum value of the VSWR of the second comparative example is superior to that of the surface acoustic wave filter according to the above-described preferred embodiment. The reason for this is that the above-described inductance was interposed between the first balanced signal terminal 503 and the second balanced signal terminal 504 in the first comparative example so as to achieve impedance matching. If the inductance is not interposed, the maximum value of the VSWR of the second comparative example is inferior to that of the surface acoustic wave filter according to the above-described preferred embodiment, and becomes approximately about 2.00.

According to the above-described preferred embodiment, the maximum insertion loss in the passband is reduced by about 0.25 dB as compared to the surface acoustic wave filter of the second comparative example. The reason for this is that the electrode finger cross width of the surface acoustic wave filter according to the above-described preferred embodiment is less than that of the second comparative example and an ohmic resistance is therefore reduced.

In addition, the electrode finger cross width of the second comparative example is approximately 2.4 times that of the surface acoustic wave filter 1 according to the above-described preferred embodiment. That is, the electrode finger cross width of the second comparative example must be increased. In order to increase the electrode finger cross width, not only the area of the piezoelectric substrate but also the size of the entire surface acoustic wave filter element must be increased. Accordingly, in the case of the surface acoustic wave filter according to the above-described preferred embodiment, miniaturization of the surface acoustic wave elements is achieved as compared to the second comparative example. Furthermore, the number of surface acoustic wave filter elements that can be made from a single wafer is increased, and productivity is therefore improved.

Thus, the surface acoustic wave filter 1 according to this preferred embodiment improves the insertion loss and VSWR in the pass band as compared to the surface acoustic wave filters of the first and second comparative examples. Furthermore, as described above, by setting the numbers N1 and N2 which are the electrode finger numbers in the narrow pitch electrode finger portions to N1>N2, the ratio of the impedance of the unbalanced signal terminal 31 to the impedance of the balanced signal terminals 32 and 33 can be easily set to about 1:2.

In a surface acoustic wave filter such as the surface acoustic wave filter 1, an input impedance is typically set to about 50Ω. Accordingly, by controlling the numbers N1 and N2, the impedance of the balanced signal terminals 32 and 33 can be easily set to about 100Ω without increasing the VSWR and the maximum insertion loss in the passband.

The reason that the impedance of the unbalanced signal terminal 31 and the impedance of the balanced signal terminals 32 and 33 can be easily changed without losing passband characteristics is not readily apparent, but will be experimentally described with reference to FIGS. 11 to 14.

A first reference example is designed so that both of the impedance of the unbalanced signal terminal 31 and the impedance of the balanced signal terminals 32 and 33 can be set to about 50Ω. First, the reflection characteristics of this first reference example will be shown in FIGS. 11A and 11B. The normalized impedance of the unbalanced signal terminal and the normalized impedance of the balanced signal terminals are about 50Ω in Smith charts in FIGS. 11A and 11B. Design parameters at that time are as follows.

Cross width of each of the first longitudinally coupled resonator surface acoustic wave filter unit 11 and the second longitudinally coupled resonator surface acoustic wave filter unit 21: 44.0 λI Numbers of electrode fingers in IDTs included in each of the first longitudinally coupled resonator surface acoustic wave filter unit 11 and the second longitudinally coupled resonator surface acoustic wave filter unit 21: 28 (4)/(4) 38 (4)/(4) 28

Number of electrode fingers included in a reflector: 30

Metallization ratio: 0.70

Electrode film thickness: 0.079 λI

Figure 12A:
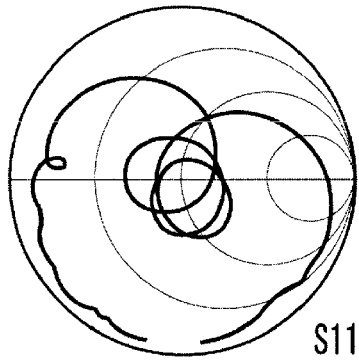
FIGS. 12A and 12B are Smith charts showing the reflection characteristics of the unbalanced signal terminal and the balanced signal terminals included in the surface acoustic wave filter units in the first reference example.
Figure 12B:
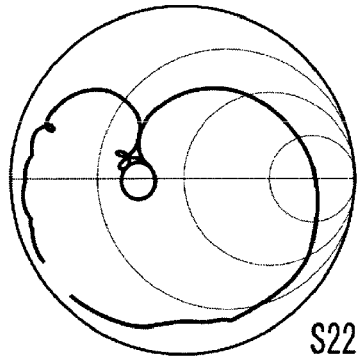

Here, it is assumed that the impedance of the unbalanced signal terminal is about 50Ω and the impedance of the balanced signal terminals is about 100Ω in a surface acoustic wave filter designed as above as the first reference example. FIGS. 12A and 12B show reflection characteristics of the unbalanced signal terminal and the balanced signal terminals at that time. As a matter of course, the impedance of S22, that is, the impedance of the balanced signal terminals deviates significantly from an impedance matching point of about 100Ω.

Figure 13A:
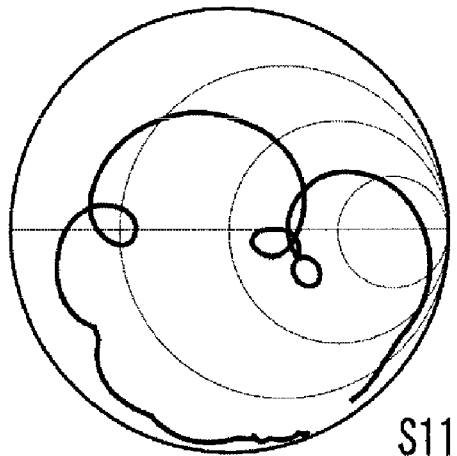
FIGS. 13A and 13B are Smith charts showing the reflection characteristics of an unbalanced signal terminal and balanced signal terminals included in surface acoustic wave filter units in a second reference example.
Figure 13B:
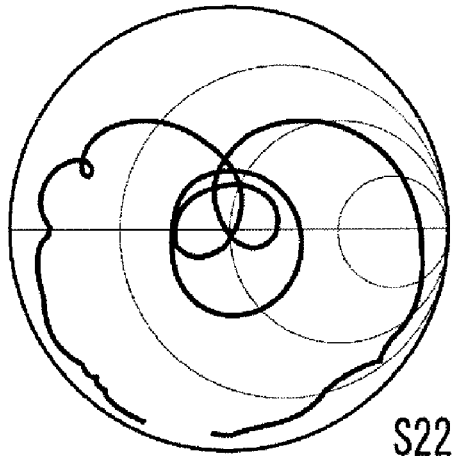

Next, in order to change the impedance of S22 to about 100Ω, a surface acoustic wave filter of a second reference example is obtained by varying the surface acoustic wave filter of the first reference example. The surface acoustic wave filter of the first reference example is varied so that the cross widths of the first longitudinally coupled resonator surface acoustic wave filter unit 11 and the second longitudinally coupled resonator surface acoustic wave filter unit 21 are changed from about 44.0 λI to about 24.2 λI. The reflection characteristics of the surface acoustic wave filter of the second reference example are shown in FIGS. 13A and 13B. As shown in FIGS. 13A and 13B, although the impedance of S22 becomes approximately 100Ω, the impedance of S11 also becomes approximately 100Ω and deviates significantly from 50Ω, which is the matching point of the unbalanced signal terminal.

Figure 14A:
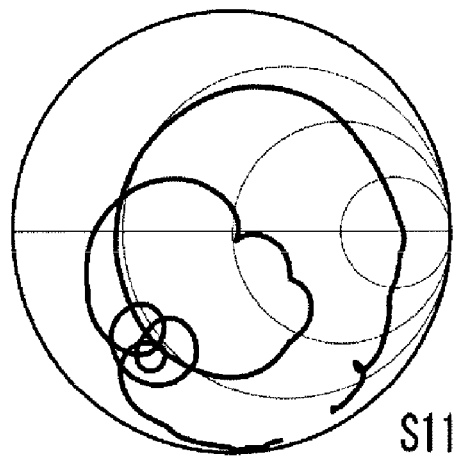
FIGS. 14A and 14B are Smith charts showing the reflection characteristics of an unbalanced signal terminal and balanced signal terminals included in surface acoustic wave filter units in a third reference example.
Figure 14B:
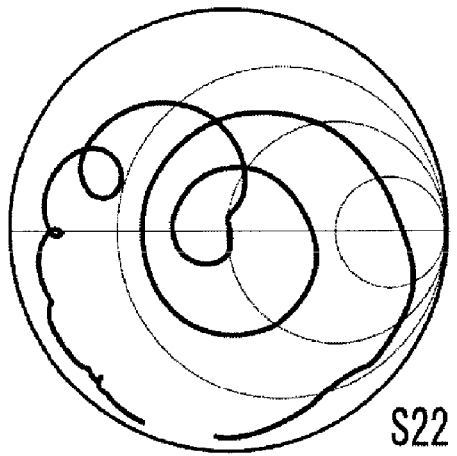

In order to change the impedance of S11 in the second reference example to about 50Ω, a surface acoustic wave filter of a third reference example is obtained by changing the number of electrode fingers included in each of the narrow pitch electrode finger portions N in the center second IDT 13 of the first longitudinally coupled resonator surface acoustic wave filter unit 11 from four to eight. The reflection characteristics of this third reference example are shown in FIGS. 14A and 14B. As shown in FIGS. 14A and 14B, the impedance of S22 becomes the matching point of about 100Ω, and the impedance of S11 is close to the matching point of 50Ω. Finally, by controlling design parameters, such as the electrode finger pitch of the narrow pitch electrode finger portion N and a space between adjacent IDTs, the reflection characteristics shown in FIGS. 4A and 4B are achieved.

Thus, in the balanced-type surface acoustic wave filter 1 in which the first longitudinally coupled resonator surface acoustic wave filter unit 11 and the second longitudinally coupled resonator surface acoustic wave filter unit 21 are connected in a cascade arrangement, the number N1 of electrode fingers included in each of the narrow pitch electrode finger portions N in the IDT 13 connected to the unbalanced signal terminal 31 is greater than the number N2 of electrode fingers included in each of the narrow pitch electrode finger portions N in the IDT 23 connected to the balanced signal terminals 32 and 33. Consequently, the insertion loss and VSWR in the passband are improved. In addition, a surface acoustic wave filter is provided which is capable of achieving the ratio of the impedance of the unbalanced signal terminal to the impedance of the balanced signal terminals 32 and 33 of approximately 1:2 by reducing the impedance of the balanced signal terminals.

In the above-described preferred embodiment, in order to perform impedance control, the numbers N1 and N2 of electrode fingers included in the narrow pitch electrode finger portions are different from each other and the electrode finger pitches P1 and P2 of the narrow pitch electrode finger portions are also different from each other. However, if the condition N1>N2 can be achieved, it is not necessarily required to satisfy the condition P1>P2. If the condition P1>P2 is also satisfied, the VSWR and the maximum insertion loss in the passband is further improved.

Furthermore, other impedance control methods, for example, a method of setting different duty ratio electrodes for each IDT or different electrode finger cross widths for each IDT, may be additionally used.

In the above-described preferred embodiment, the IDTs 12 to 14 and the IDTs 22 to 24 are configured such that an electric signal propagating through the first signal line 34 is 180° out of phase with an electric signal propagating through the second signal line 35. However, the first to sixth IDTs may be configured so that the phases of electric signals propagating through the first and second signal lines are the same. In reality, it is desirable that the first to sixth IDTs be configured so that the phases of electric signals propagating through the first signal line 34 and the second signal line 35 are different by 180°. In this case, as described in the above-described preferred embodiment, the amplitude balance and the phase balance are improved.

In this preferred embodiment, a 40±5° Y-cut X-propagating $LiTaO_3$ substrate is used as the piezoelectric substrate 2. However, other piezoelectric substrates using various cutting angles and piezoelectric single crystals such as a 64° to 72° Y-cut X-propagating $LiNbO_3$ substrate and a 41° Y-cut X-propagating $LiNbO_3$ substrate may be used.

In FIG. 1, one end of each of the IDTs 12 and 22 is connected to the ground potential. One end of the IDT 12 which is connected to the ground potential and one end of the IDT 22 which is connected to the ground potential may be connected on the piezoelectric substrate by providing wiring therebetween. Likewise, one end of the IDT 14 which is connected to the ground potential and one end of the IDT 24 which is connected to the ground potential may be connected on the piezoelectric substrate 2 by providing wiring therebetween.

In the above-described preferred embodiment, a one-port surface acoustic wave resonator may be interposed between the unbalanced signal terminal 31 and one end of the second IDT 13 as appropriate. Furthermore, a one-port surface acoustic wave resonator may be interposed between the first balanced signal terminal 32 and the fifth IDT 23, and between the second balanced signal terminal 33 and the fifth IDT 23.

Furthermore, two one-port surface acoustic wave resonators may be interposed between the first longitudinally coupled resonator surface acoustic wave filter unit 11 and the second longitudinally coupled resonator surface acoustic wave filter unit 21. That is, a first one-port surface acoustic wave resonator may be interposed between the first IDT 12 and the fourth IDT 22, and a second one-port surface acoustic wave resonator may be interposed between the third IDT 14 and the sixth IDT 24.

Furthermore, a two-port surface acoustic wave resonator may be interposed between the first longitudinally coupled resonator surface acoustic wave filter unit 11 and the second longitudinally coupled resonator surface acoustic wave filter unit 21. That is, the first port of the two-port surface acoustic wave resonator may be connected between the first IDT 12 and the fourth IDT 22, and the second port of the two-port surface acoustic wave resonator may be connected between the third IDT 14 and the sixth IDT 24.

While preferred embodiments of the present invention have been described above, it is to be understood that variations and modifications will be apparent to those skilled in the art without departing the scope and spirit of the present invention. The scope of the present invention, therefore, is to be determined solely by the following claims.

What is claimed is:

1. A balanced-type surface acoustic wave filter including an unbalanced signal terminal and first and second balanced signal terminals, and having a balanced-to-unbalanced conversion function, the balanced-type surface acoustic wave filter comprising:

a piezoelectric substrate;

a first longitudinally coupled resonator surface acoustic wave filter unit including first, second, and third IDTs disposed along a propagation direction of a surface acoustic wave on the piezoelectric substrate, the second IDT being connected to the unbalanced signal terminal; and a second longitudinally coupled resonator surface acoustic wave filter unit including fourth, fifth, and sixth IDTs disposed along a propagation direction of a surface acoustic wave on the piezoelectric substrate, the second longitudinally coupled resonator surface acoustic wave filter unit being connected in a cascade arrangement to the first longitudinally coupled resonator surface acoustic wave filter unit, the fifth IDT being connected to the first and second balanced signal terminals; wherein the second IDT includes narrow pitch electrode finger portions extending from end portions adjacent to the first and third IDTs toward a center thereof in the propagation direction of the surface acoustic wave, and the fifth IDT includes narrow pitch electrode finger portions extending from end portions adjacent to the fourth and sixth IDTs toward a center thereof in the propagation direction of the surface acoustic wave, each of the narrow pitch electrode finger portions including some electrode fingers whose electrode periods are less than those of electrode fingers in a center portion of a corresponding IDT; and when the number of electrode fingers included in each of the narrow pitch electrode finger portions in the second IDT is defined as N1 and the number of electrode fingers included in each of the narrow pitch electrode finger portions in the fifth IDT is defined as N2, the numbers N1 and N2 are set to N1>N2.

2. The balanced-type surface acoustic wave filter according to claim 1, wherein, when an electrode finger pitch of each of the narrow pitch electrode finger portions in the second IDT is defined as P1 and an electrode finger pitch of each of the narrow pitch electrode finger portions in the fifth IDT is defined as P2, the electrode finger pitches P1 and P2 are set to P1>P2.

3. The balanced-type surface acoustic wave filter according to claim i,further comprising:

a first signal line that connects the first and fourth IDTs; and a second signal line that connects the third and sixth IDTs; wherein the first to sixth IDTs are arranged such that an electric signal propagating through the first signal line is 180° out of phase with an electric signal propagating through the second signal line.

4. The balanced-type surface acoustic wave filter according to claim 1, wherein the piezoelectric substrate is a 40±5° Y-cut x-propagating LiTaO$_3$ substrate.

5. The balanced-type surface acoustic wave filter according to claim 1, wherein first longitudinally coupled resonator surface acoustic wave filter unit further comprises reflectors disposed on either side of a region including the first, second, and third IDTs.

6. The balanced-type surface acoustic wave filter according to claim 1, wherein second longitudinally coupled resonator surface acoustic wave filter unit further comprises reflectors disposed on either side of a region including the first, second, and third IDTs.

7. The balanced-type surface acoustic wave filter according to claim 1, wherein the second IDT includes an even number of electrode fingers.

8. The balanced-type surface acoustic wave filter according to claim 1, wherein the first longitudinally coupled resonator surface acoustic wave filter unit and the second longitudinally coupled resonator surface acoustic wave filter unit are made of at least one of Al and an Al alloy.

9. The balanced-type surface acoustic wave filter according to claim 1, wherein the piezoelectric substrate is a 64° to 72° Y-cut x-propagating LiNbO$_3$ substrate.

10. The balanced-type surface acoustic wave filter according to claim 1, wherein the piezoelectric substrate is a 41° Y-cut x-propagating LiTaO$_3$ substrate.

* * * * *